(12) United States Patent
Marten

(10) Patent No.: US 9,217,759 B2
(45) Date of Patent: Dec. 22, 2015

(54) CURRENT SHUNT

(71) Applicant: Sendyne Corporation, New York, NY (US)

(72) Inventor: Victor Marten, Flushing, NY (US)

(73) Assignee: Sendyne Corporation, New York, NY (US)

( * ) Notice: Subject to any disclaimer, the term of this patent is extended or adjusted under 35 U.S.C. 154(b) by 0 days.

(21) Appl. No.: 13/703,742

(22) PCT Filed: Dec. 11, 2012

(86) PCT No.: PCT/IB2012/057187
§ 371 (c)(1),
(2) Date: Dec. 14, 2012

(87) PCT Pub. No.: WO2013/093714
PCT Pub. Date: Jun. 27, 2013

(65) Prior Publication Data
US 2013/0328547 A1  Dec. 12, 2013

Related U.S. Application Data

(60) Provisional application No. 61/580,136, filed on Dec. 23, 2011.

(51) Int. Cl.
*G01R 1/20* (2006.01)
*G11B 5/00* (2006.01)
*G11B 5/455* (2006.01)
(Continued)

(52) U.S. Cl.
CPC . *G01R 1/203* (2013.01); *G01R 1/20* (2013.01); *G01R 19/0092* (2013.01); *G11B 5/012* (2013.01); *G11B 5/455* (2013.01); *G11B 2005/001* (2013.01); *G11B 2005/0016* (2013.01)

(58) Field of Classification Search
CPC .. G01R 1/203; G11B 5/455; G11B 2005/001; G11B 5/012; G11B 2005/0016
USPC .................................................. 324/210, 126
See application file for complete search history.

(56) References Cited

U.S. PATENT DOCUMENTS

| 4,494,068 | A | * | 1/1985 | Ley et al. | ................ | H01C 3/02 324/126 |
| 5,214,407 | A | * | 5/1993 | McKim, Jr. et al. | ... | G01R 1/203 338/120 |
| 6,208,151 | B1 | * | 3/2001 | Aton et al. | ............. | G01R 1/071 324/691 |

(Continued)

FOREIGN PATENT DOCUMENTS

KR  102010-0042782 A  4/2010

OTHER PUBLICATIONS

International Search Report mailed Apr. 29, 2013 in PCT/IB2012/057187.

*Primary Examiner* — Patrick Assouad
*Assistant Examiner* — Christopher McAndrew
(74) *Attorney, Agent, or Firm* — Oppedahl Patent Law Firm LLC

(57) ABSTRACT

Methods and circuits for reduction of errors in a current shunt are disclosed, for example sensing lines for Kelvin sensing in which the sensing lines are of identical material to the high-resistance portions of the shunt, and welded thereto. This allows application of a current shunt with lower output voltage and thus lower power losses than the contemporary art implementations, while maintaining high accuracy with regard to temperature changes.

31 Claims, 3 Drawing Sheets

(51) Int. Cl.
  *G11B 5/012* (2006.01)
  *G01R 19/00* (2006.01)

(56) References Cited

U.S. PATENT DOCUMENTS

| | | | |
|---|---|---|---|
| 7,106,046 B2 | 9/2006 | Nagano et al. | |
| 7,591,193 B2* | 9/2009 | Snell | B82Y 15/00 73/861.85 |
| 7,699,209 B2* | 4/2010 | Tei | B23K 20/004 228/102 |
| 7,982,504 B1* | 7/2011 | Robinett | H01L 21/823871 326/101 |
| 8,058,871 B2 | 11/2011 | Guo et al. | |
| 8,102,668 B2* | 1/2012 | Hauenstein | H01L 23/495 174/260 |
| 8,253,225 B2* | 8/2012 | Otremba | H01L 23/4952 257/678 |
| 8,253,443 B2* | 8/2012 | Robinett | H01L 45/04 326/101 |
| 2009/0157334 A1* | 6/2009 | Goodnow et al. | H03K 19/0008 702/61 |
| 2011/0089931 A1 | 4/2011 | Podlisk et al. | |
| 2011/0267038 A1* | 11/2011 | Homma | G01R 1/203 324/126 |
| 2013/0009655 A1 | 1/2013 | Marten | |

* cited by examiner (a)

(b)

CURRENT SHUNT

BACKGROUND

It is not easy to measure currents accurately and over large dynamic ranges.

The most common method of current sensing is to pass the current through a resistor (a current shunt) and to measure the resulting voltage drop, which develops according to Ohm's law. A well-known current sensor circuit based on this principle is illustrated in FIGS. 1a, 1b, and 1c.

Input terminals 3/3a and 4/4a allow connection of the current shunt 1 into the circuit where current has to be measured. FIG. 1a, as an example, shows that the actual connection points on the input terminals are simple holes 3a and 4a to which properly terminated power cable can be attached, both electrically and mechanically, by means of bolts and nuts or other suitable fasteners. This configuration is typical of current sensors capable of measuring several tens to several hundreds of Amperes.

An electronic circuit (omitted for clarity in FIG. 1a) measures voltage across the current shunt 1, via the sense lines 9 and 10; the actual current value is derived by the Ohm's law with the knowledge of the shunt's resistance.

Pick-up points 7 and 8 on the current shunt 1 follow the principle of "Kelvin sensing" that reduces errors associated with resistance of the sense connections and wires, considering the fact that there is almost no current in these sensing connections. The point made by "Kelvin sensing" is that because the current in lines 9 and 10 is extremely small, the voltage drop along lines 9 and 10 is likewise extremely small, and thus the voltage drop along lines 9 and 10 does not introduce very much error in the overall current measurement process. It will be appreciated that the pick-up points 7 and 8 are separate from and are specifically located apart from the main terminals 3a/4a of the shunt.

Typically, the shunt is created by joining three conducting sections with varying conductive properties. Sections 3 and 4 are made from highly conductive material (typically copper), and central section 2 is made from a material that has higher resistance as compared with that of copper, a material whose resistance has little or no dependence upon the magnitude of the current passing through the material, and the material having a resistance that has little or no dependence upon the temperature of the material. Some investigators choose this material to be "manganin", an alloy of typically 86% copper, 12% manganese, and 2% nickel. The reasons for such a construction, among a few, include the desire to equalize the current density in the resistive material 2, and to minimize errors arising out of resistance variations due to magnitude of current or due to changes in temperature. The choice to have a central section differing in its material from end sections, and the choice of particular material for that central section, are outside of the scope of the present discussion, and as will later be appreciated, the teachings of the invention offer their benefits in ways that are not dependent upon such choices.

The thoughtful reader will appreciate that in the particular case where a shunt is selected to have such a central section 2 of non-identical material from the end sections, the shunt amounts to a thermocouple circuit, with the junctions of the thermocouples created by the joining of dissimilar materials in areas 5 and 6, and schematically depicted in the electrical model in FIG. 1(b). Temperature difference between areas 5 and 6 will create thermoelectric voltage on the sense lines 9 and 10; unfortunately, this voltage creates an error in the measured voltage across the shunt, and thus creates an error in the ultimate derived value for the measured current.

Furthermore, the attachment method of the sense lines 9 and 10 at points 7 and 8 may have a large effect on the total thermoelectric errors, as illustrated in FIGS. 1b and 1c. Typical sense lines 9 and 10 are made from copper and may, in fact, be simply traces on a printed circuit board (PCB). Connections to the current shunt at points 7 and 8 are typically made by soldering the sense lines to the shunt; solder material 7b in FIG. 1c is located between copper section 3 and sense line 9; at areas 7a and 7c this creates another pair of thermocouples. Any temperature difference between areas 7a and 7c will produce additional voltage errors.

The same considerations apply for the thermocouples created at junction 8 and shown schematically in FIGS. 1b as 8a, 8b, and 8c.

Stating the situation in a different way and looking at FIG. 1b it is clear that thermoelectric voltages described above are connected in series with the voltage to be measured in element 2, thus giving rise to errors in the measured voltage and in the derived current value.

The designer of a shunt as shown in FIG. 1a must, of course, select locations 7 and 8 for the connection points for lines 9 and 10. Locations 7 and 8 will usually be selected to lie along a center line. Likewise nut-and-bolt connection points 3a and 4a will usually be selected to lie along the center line just mentioned. Finally, the designer of the shunt will usually be seen to design the shunt generally to have more or less reflective symmetry about the center line (to the left and to the right in FIG. 1a); usually this reflective symmetry is due not so much to any conscious choice as merely to simplicity and ease of manufacture.

The designer of the shunt as shown in FIG. 1a must also select locations 7 and 8 (vertically in FIG. 1a) along the center line. The usual design choice is to maximize the voltage output at sense lines 9 and 10 so as to maximize the signal-to-noise ratio for the sensed voltage. To maximize the voltage, the designer selects locations 7 and 8 to be farther apart from each other rather than closer together. The locations 7 and 8 are selected to be less far apart than nut-and-bolt connections 3a and 4a, but still quite far apart. It is not desired that location 7 be particularly nearby to point 3a and it is not desired that location 8 be particularly nearby to point 4a.

It would be very desirable if apparatus could be devised which would reduce or eliminate errors in the derived current value that arise because of such thermoelectric voltages.

SUMMARY OF THE INVENTION

Structures are described in which identical or substantially identical materials are used for sense lines as for the shunt materials to which the sense lines are electrically connected, and in which many if not all thermocouple-induced errors are eliminated when compared with prior-art structures. Methods and circuits for reduction of errors in a current shunt are disclosed, for example sensing lines for Kelvin sensing in which the sensing lines are of identical material to the high-resistance portions of the shunt, and welded thereto. This allows application of a current shunt with lower output voltage and thus lower power losses than the contemporary art implementations, while maintaining high accuracy in the face of temperature changes.

DESCRIPTION OF THE DRAWING

This invention will be described with respect to a drawing in several figures, of which.

DETAILED DESCRIPTION

Figure 2:
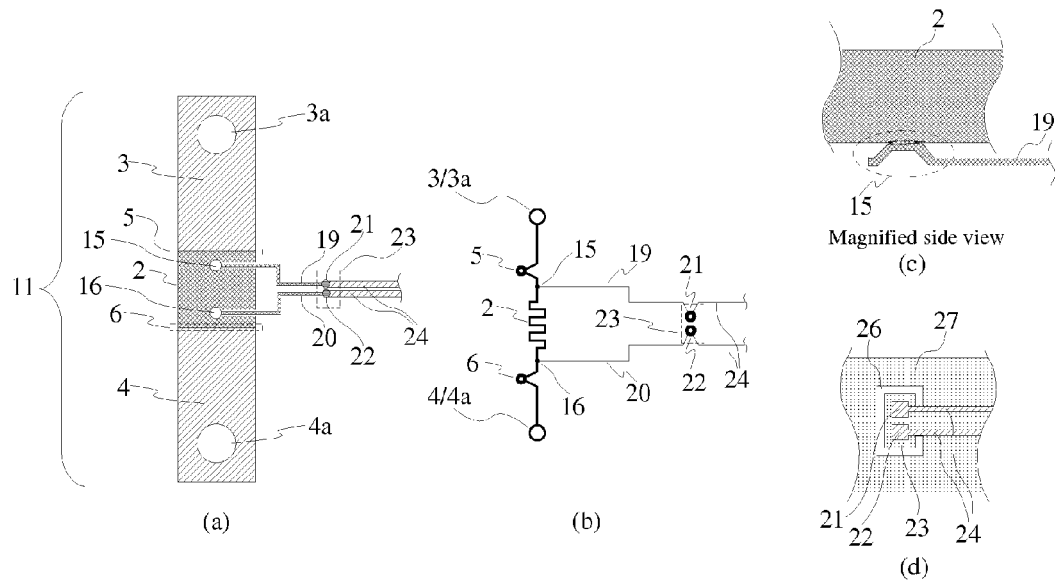
FIGS. 2a, 2b, 2c and 2d disclose one method of the invention.

One purpose of the invention is to reduce the errors associated with thermoelectric voltages in the current shunt. In the simplest form (referring to FIGS. 2a and 2b), the method according to this invention requires simultaneous fulfillment of several requirements, namely:

a.) Connecting points 15/16 for the sense lines 19/20 must be located on the element 2 of the shunt 11 (and not on the elements 3/4 as in the previous art).

b.) Material of the sense lines 19/20 must be the same as the material of the resistive element 2.

c.) The attachment technique between the element 2 and sense lines 19/20 must not introduce any other materials into the joint. A preferred method of attachment will soften and liquefy small adjacent areas of both element 2 and sense lines 19/20; after cooling down element 2 and sense lines 19/20 will remain attached to each other and will maintain low resistance of the attachment points, as illustrated in FIG. 2c. Suitable industrial processes may include welding by application of heat or localized electrical current, a so-called technique of Electrical Resistive Welding (ERW), also known as "Spot Welding", "Electrical Discharge Welding", "Flash Welding"; methods that apply high-frequency RF, plasma, high-intensity electron beams, and X-ray energy may be utilized as well; an underlying requirement is that the selected process applies the energy in a small and well-defined area, and causes localized softening, liquefaction, and diffusion of the materials of the element 2 and sense lines 19/20, without significant effect on the rest of the element 2 and sense lines 19/20, as these may have been previously processed by thermal treatment in order to obtain the required properties for utilization in the current shunt.

d.) At the input ports 24 of electronic measuring apparatus (detail omitted from FIG. 2a for clarity), both sense lines 19/20 must terminate in the area 23 that assures equal temperature of both junctions 21/22 between sense lines 19/20 and input lines 24 of the measuring apparatus; this arrangement may be termed an "isothermal block".

e.) Sense lines 19/20 should extend well past the surface and/or the edge of the Current Shunt 11, in order to provide a measure of thermal isolation between the Current Shunt body and the isothermal block 23; for the same reason, it is advantageous if the material of the sense lines 19/20 has relatively high thermal resistance; in other words, it is preferred that the material of elements 19/20 should not easily conduct heat. On one hand, as the heat in metals and metal alloys is typically transferred by the same transport mechanism as the electricity, by the electrons, if the material of sense lines 19/20 has lower conductivity than sections 3/4 then it will have corresponding lower ability to conduct heat; on the other hand, if cross-section of sense lines 19/20 is small, it will also impede heat conduction. An optimal configuration would depend on the particular construction of the current shunt and the intended use environment. Furthermore, additional means of thermal isolation could be applied between the shunt 11 and isothermal block 23; in particular, if block 23 is located on the PCB that is also attached to the shunt 11, then a strategically located slot in the PCB substrate will increase the thermal isolation of block 23 from shunt 11; referring to FIG. 2d, utilization of an advantageously shaped slot 26 in the PCB 27 will help in creating a low thermal differential between points 21 and 22, thereby improving functions of the isothermal block 23.

When all the above requirements a.) through e.) are fulfilled, the measurements from the resulting current shunt 11 should be substantially free from thermoelectric errors.

An alert reader will notice that voltage-sensing points 15/16 according to the invention are located contrary to the previous-art method of maximizing the voltage output from the current shunt. Saying this another way, in FIG. 1a the points 7 and 8 were described as being as far apart from each other as could be arranged while still keeping point 7 away from point 3a and while still keeping point 8 away from point 4a. In contrast in FIG. 2a the points 15 and 16 are closer together (in a topological sense) than points 7 and 8 in FIG. 1a. In FIG. 1a, the points 7 and 8 have junctions 5 and 6 between them, while in FIG. 2a, the junctions 5 and 6 have points 15 and 16 between them. Depending on the materials choices in FIG. 1a and in FIG. 2a, and depending on choices of dimensions of the shunt in FIG. 1a and in FIG. 2a, it may well work out that the sense voltage developed from a given amount of current to be measured is smaller in FIG. 2a than in FIG. 1a. It might be thought that this would make the sensing arrangement of FIG. 2a less accurate than the arrangement of FIG. 1a (due to a poorer signal-to-noise ratio) but such is not the case.

Indeed the output voltage of the shunt according to the invention may be somewhat smaller compared to the output voltage of the shunt according to the prior art, while still providing improved accuracy as compared with the prior-art arrangement, even if all other parameters of the shunt and the passing current through the shunt are the same.

One of the points being made here is that the improved shunt offers an output signal that is effectively free from thermoelectric errors, and that some reduction in the output signal (as compared with the prior art) can be tolerated and readily compensated for by the electronic measuring apparatus; for example, such measuring systems are described in U.S. Pat. No. 8,264,216 entitled "High-accuracy low-power current sensor with large dynamic range" and in published international patent application WO12/117275 entitled "Current sensor".

In addition, a signal that is not contaminated with thermoelectric errors can be much smaller for the same signal-to-error ratio than a large signal that has substantial error component; this allows significant reduction of energy loss due to heating in the shunt. Saying this another way, the improved signal-to-noise ratio offered by the teachings of the invention permit the shunt designer to design it so as to have a smaller resistance. The smaller resistance means less $I^2R$ loss in the shunt and thus less heating. Less heating means less energy loss due to the heating, and means smaller temperature-related errors introduced into the measurement process. Compared with prior art, this invention allows one or more orders of magnitude of improvement for the losses in the shunt.

FIG. 3a discloses a current shunt 12 that can supply information about the actual operating temperature of the shunt element 2, in addition to reduced thermoelectric errors.

Two extra sensing points are created at locations 15a and 16a, with material of the leads 19a/20a being copper or other suitable material, but not the same material as the shunt element 2 or leads 19/20. The attachment method should be the same as outlined in requirement c.) above.

Figure 1:
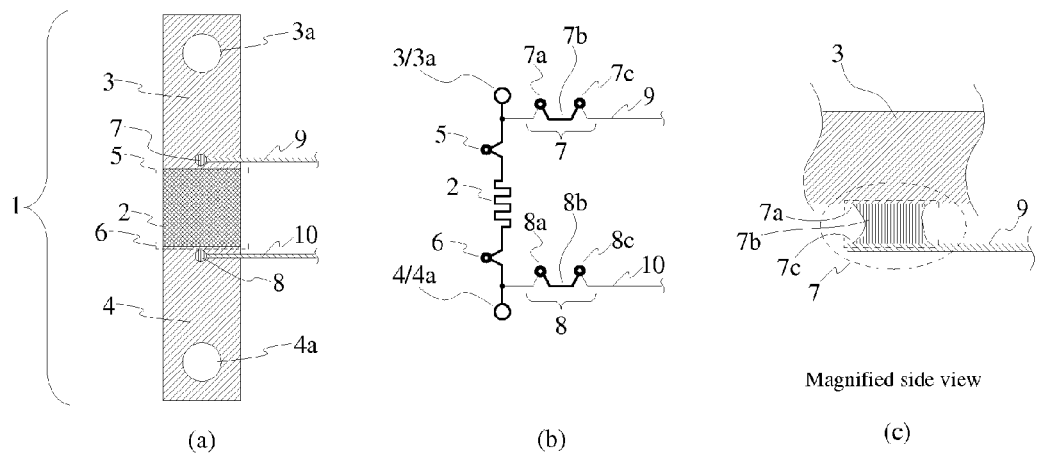
FIGS. 1a, 1b, and 1c depict prior-art circuits.

The alert reader that appreciated the existence of thermocouples at 5 and 6 in FIG. 1 will immediately recognize that points 15a and 16a in FIG. 3a create thermocouples as well.

Such thermocouples have outputs which can be sensed via leads 19a/20a (and, of course, utilizing leads 19/20). This allows for the sensing of the temperature at 15a and 16a; in turn, knowledge of the temperature of the shunt element 2 permits compensation for the changes of resistance of element 2, and possibly eradication of residual thermoelectric errors due to slightly different material properties between leads 19/20 and element 2.

FIG. 3b presents an electrical schematic model of the shunt 12 in FIG. 3(a).

While voltage sensing points 15/16 are preferably located on the center line of the shunt 12 (in accord to the best current measurement functionality), the points 15a and 16a are located on the lines emanating from points 15/16 and perpendicular to the center line of the shunt; the intent here is that point 15a is located at such a position on the section 2 that its temperature is substantially the same as the temperature of point 15; likewise for points 16a and 16 (the reader is reminded that the temperatures of points 15 and 16 are not necessarily the same). FIG. 3a shows the center line by dashed and dotted lines passing through holes 3a and 4a.

At the same time any voltage differential from point 15a to point 15, and between 16a and 16, generated due to the current passing through the shunt, is nearly zero.

Stated differently, pair 15a/15 is located on what are hoped to be isopotential and isothermal lines (as present on element 2 due to temperature gradients and the current passing through the shunt); likewise for pair 16a/16.

Figure 3:
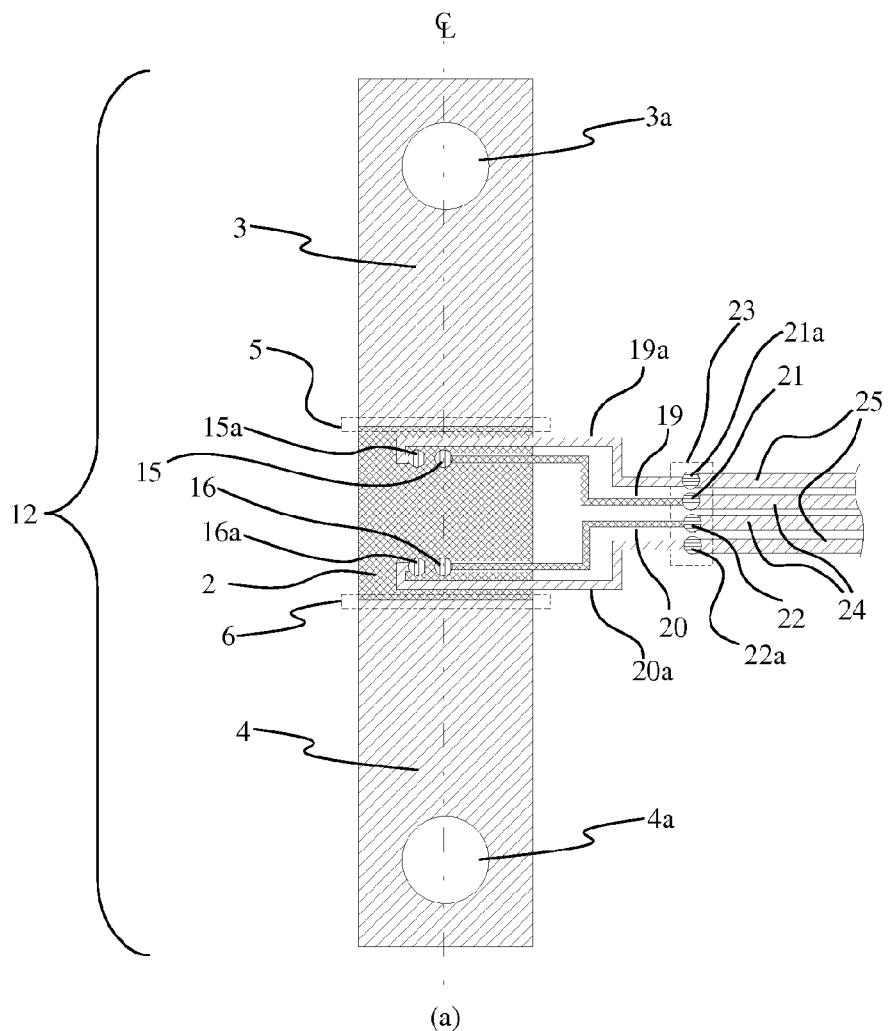
FIGS. 3a and 3b show a current shunt with expanded capabilities according to the invention.
Figure 3:
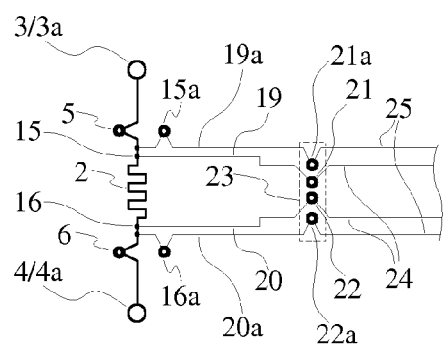

A further improvement of the shunt in FIG. 3 is to introduce another thermocouple sensing point exactly in the middle of element 2 between points 15 and 16. Such a sensing point is omitted for clarity in FIG. 3a. If such a thermocouple is present, then better knowledge of the temperature distribution across the volume of shunt element 2 can be gained, with correspondingly better ability to compensate for changes due to temperature in the resistance of element 2.

Figure 4:
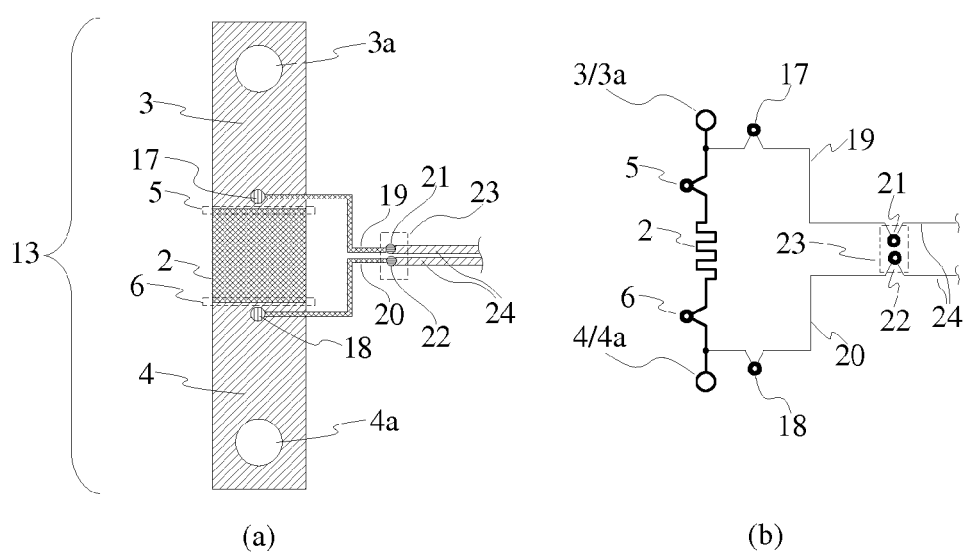
FIGS. 4a and 4b display an alternate simplified embodiment that could be used under specific limited conditions.

FIG. 4 shows another configuration of the shunt according to the invention. While this arrangement is not capable of complete reduction of thermoelectric errors under all possible conditions, it could still achieve significant reduction of thermoelectric errors, and may be desirable due to simpler construction.

In FIG. 4a the sense points 17/18 are located respectively on the portions 3 and 4 of the shunt. The sense leads 19, 20 are made from the same material as the shunt element 2. Such an arrangement creates a thermocouple at point 17, and a thermocouple at point 18 in addition to a thermocouple between element 2 and sections 3 at area 5, and a thermocouple between element 2 and section 4 in the area 6. This is illustrated in electrical schematic model form in FIG. 4b.

Isothermal block 23 keeps the temperature of the leads 19/20 the same at joints 21/22 to the input lines 24 of the electrical measuring apparatus (omitted for clarity in FIG. 4a).

The output voltage of the shunt consists of the sum of the voltage across the shunt due to the passing current, together with the voltages developed across the thermocouple pairs 17/5 and 6/18. As the distance between area 5 and point 17 (likewise, area 6 to point 18) is much smaller than the distance between area 5 and 6, the magnitude of the temperature difference is much smaller between 5 and 17 (also, 6 and 18) as compared with the likely temperature differential from 6 to 5. Correspondingly, the magnitude of generated thermoelectric voltage in pairs 5/17 and 6/18 is much smaller than the generated voltage in pair 5/6. Therefore, the sum of the thermoelectric error voltages from pairs 5/17 and 6/18 will be smaller than the error from pair 5/6 in the original prior-art arrangement in FIGS. 1a, 1b, and 1c.

Saying this differently, the designer of shunt 13 in FIG. 4a will likely select a location for point 17 that is fairly close to junction 5, and will likely select a location for point 18 that is fairly close to junction 6. Again as discussed above in connection with FIG. 2a, the designer will likely select locations for points 17 and 18 (and points 3a and 4a) that are on the center line of shunt 13.

Even better performance is expected when the temperature gradient imposed across the shunt is generated in the element 2 itself, as is typically the case when current is passing through the shunt and creates heat in element 2 and, to lower degree, in sections 3 and 4. (The reader is reminded that the resistance of element 2, due to material selection by the designer, is typically much higher than the resistance of both sections 3 and 4).

Under such conditions, the thermoelectric voltages generated in pairs 5/17 and 6/18 are roughly the same in magnitude but opposite in sign; the voltages from pairs 5/17 and 6/18 will cancel each other, and the desired output of the shunt at 24 will be substantially free from errors.

Stating a set of requirement for the arrangement in FIG. 4a:
f.) Connecting points 17/18 for the sense lines 19/20 are located on elements 3/4 of the shunt 13, as close as possible to respective areas 5 and 6.
g.) Material of the sense lines 19/20 should be the same as the material of the resistive element 2.
h.) The attachment technique between elements 3/4 and sense lines 19/20 must not introduce any other materials into the joint. A preferred method of attachment was discussed in c.) above.
i.) At the input ports of electronic measuring apparatus, both sense lines 19/20 must terminate in "isothermal block" area 23 that assures equal temperature of both junctions 21/22 between sense lines 19/20 and input lines 24 of the measuring apparatus.
j.) Thermal isolation is incorporated between the Current Shunt body and the isothermal block 23.

It will be appreciated that the alert and thoughtful reader may readily devise myriad obvious variations and improvements upon the invention, without departing from the invention at all. Any and all variations and improvements are intended to be encompassed within the claims which follow.

The invention claimed is:
1. A method for measurement of a current, the method comprising the steps of:
  passing the current through a shunt, the passage of the first current through the shunt defining a flow path from a first point to a second point to a third point to a fourth point;
  the shunt composed between the first point and the second point of a first material;
  the shunt composed between the second point and the third point of a second material;
  the shunt composed between the third point and the fourth point of a third material;
  communicating a potential from a first sensing point through a first sensing line to a fifth point, the first sensing line composed between the first sensing point and the fifth point of a fourth material;
  communicating a potential from a second sensing point through a second sensing line to a sixth point, the second sensing line composed between the sixth point and the second sensing point of a fifth material;

the second and fourth materials being of identical composition and being electrically and mechanically bonded, said bond substantially free of anything other than said identical composition;

the second and fifth materials being of identical composition and being electrically and mechanically bonded, said bond substantially free of anything other than said identical composition;

the first and third materials being electrically conductive;

the second material being of higher resistance than the first and third materials;

wherein a respective identical composition of the second and fifth materials and a respective identical composition of the second and fourth materials are identical;

the method further comprising providing a conductor from the fifth point to a seventh point, said conductor composed of a sixth material non-identical to the fourth material, and providing a conductor from the sixth point to an eighth point, said conductor composed of a seventh material non-identical to the fifth material, the fifth and sixth points juxtaposed nearby to each other, the fifth and sixth points taken together being thermally isolated from the shunt;

communicating a potential from the fifth point to the seventh point, and communicating a potential from the sixth point to the eighth point; and measuring voltage between the seventh point and the eighth point at a voltage measurement apparatus.

2. The method of claim 1 wherein the bonds are welded.

3. The method of claim 1 further comprising the steps of:

providing a conductor from a ninth point, the ninth point adjacent to the first sensing point in a first line perpendicular to a center line of the shunt, to a tenth point;

the conductor composed between the ninth point and the tenth point of an eighth material;

providing a conductor from an eleventh point to a twelfth point, the twelfth point adjacent to the second sensing point in a second line perpendicular to the center line of the shunt;

the conductor composed between the eleventh point and the twelfth point of a ninth material;

the eighth material and the second material being non-identical;

the ninth material and the second material being non-identical;

measuring a potential at the tenth point, said potential indicative of temperature at the ninth point; and measuring a potential at the eleventh point, said potential indicative of temperature at the twelfth point.

4. The method of claim 3 wherein the eighth and ninth materials are identical to each other.

5. The method of claim 3 wherein determination of the first current is corrected for temperature changes within the shunt by means of the temperatures indicated at the ninth point and at the twelfth point.

6. The method of claim 1 further comprising the steps of:

providing a conductor from a thirteenth point, the thirteenth point midway between the first sensing point and the second sensing point, to a fourteenth point;

the conductor composed between the thirteenth point and the fourteenth point of a tenth material;

the seventh material and the material between the second point and the third point being non-identical;

measuring a potential at the fourteenth point, said potential indicative of temperature at the thirteenth point.

7. The method of claim 6 wherein determination of the first current is corrected for temperature changes within the shunt by means of the temperature indicated at the thirteenth point.

8. Apparatus for current measurement, the apparatus comprising a shunt, the shunt defining a current flow path from a first point to a second point to a third point to a fourth point;

the shunt composed between the first point and the second point of a first material;

the shunt composed between the second point and the third point of a second material;

the shunt composed between the third point and the fourth point of a third material;

the apparatus further comprising a first sensing line from a first sensing point to a fifth point, the first sensing line composed between the first sensing point and the fifth point of a fourth material;

the apparatus further comprising a second sensing line from a sixth point to a second sensing point, the second sensing line composed between the sixth point and the second sensing point of a fifth material;

the second and fourth materials being of identical composition and being electrically and mechanically bonded, said bond substantially free of anything other than said identical composition;

the second and fifth materials being of identical composition and being electrically and mechanically bonded, said bond substantially free of anything other than said identical composition;

the first and third materials being electrically conductive;

the second material being of higher resistance than the first and third materials;

wherein a respective identical composition of the second and fourth materials and a respective identical composition of the second and fifth materials are identical;

the apparatus further comprising:

a conductor from the fifth point to a seventh point, said conductor composed of a sixth material non-identical to the fourth material, a conductor from the sixth point to an eighth point, said conductor composed of a seventh material non-identical to the fifth material, the fifth and sixth points juxtaposed nearby to each other, the fifth and sixth points taken together being thermally isolated from the shunt;

the seventh point and the eighth point disposed for connection to a voltage measurement apparatus.

9. The apparatus of claim 8 wherein the bonds are welded.

10. The apparatus of claim 8 further comprising:

an electrical conductor from a ninth point, the ninth point adjacent to the first sensing point in a first line perpendicular to a center line of the shunt, to a tenth point, the conductor composed between the ninth point and the tenth point of an eighth material, the eighth material and the second material being non-identical;

an electrical conductor from an eleventh point to a twelfth point, the twelfth point adjacent to the second sensing point in a second line perpendicular to the center line of the shunt, the conductor composed between the eleventh point and the twelfth point of a ninth material, the ninth material and the second material being non-identical;

the tenth and eleventh points disposed for connection to voltage measurement apparatus.

11. The apparatus of claim 10 further comprising:

voltage measurement apparatus connected to the tenth and eleventh points, and computational means responsive to potentials measured at the tenth point and at the eleventh point for correcting determination of current through the shunt by means of the temperatures indicated at the ninth point and at the twelfth point by the potentials measured thereat.

12. The apparatus of claim 10 wherein the eighth and ninth materials are identical to each other and wherein the first and third materials are identical to each other.

13. The apparatus of claim 10 further comprising:
an electrical conductor from a thirteenth point, the thirteenth point midway between the first sensing point and the second sensing point, to a fourteenth point, the conductor composed between the thirteenth point and the fourteenth point of a tenth material, the tenth material and the material between the first sensing point and the second sensing point being non-identical,
the fourteenth point disposed for connection to voltage measurement apparatus.

14. The apparatus of claim 13 further comprising:
voltage measurement apparatus connected to the fourteenth point, and
computational means responsive to potentials measured at the fourteenth point for correcting determination of current through the shunt by means of the temperature indicated at the thirteenth point by the potential measured thereat.

15. The apparatus of claim 8 wherein the current flow path from the first point to the second point to the third point to the fourth point is substantially along a straight line.

16. The apparatus of claim 8 further comprising a voltage measurement apparatus connected with the seventh point and the eighth point.

17. A method for measurement of a current, the method comprising the steps of:
passing the current through a shunt, the passage of the first current through the shunt defining a flow path from a first point to a second point to a third point to a fourth point;
the shunt composed between the first point and the second point of a first material;
the shunt composed between the second point and the third point of a second material;
the shunt composed between the third point and the fourth point of a third material;
communicating a potential from a first sensing point through a first sensing line to a fifth point, the conductor composed between the first sensing point and the fifth point of a fourth material;
communicating a potential from a second sensing point through a second sensing line to a sixth point, the conductor composed between the sixth point and the second sensing point of a fifth material;
wherein the fourth material is identical to the second material; and
wherein the fifth material is identical to the second material;
the first and fourth materials being of non-identical composition and being electrically and mechanically bonded;
the third and fifth materials being of non-identical composition and being electrically and mechanically bonded;
the first and third materials being electrically conductive;
the second material being of higher resistance than the first and third materials;
the fifth and sixth points juxtaposed nearby to each other, the fifth and sixth points taken together being thermally isolated from the shunt;
the method further comprising the step of communicating a potential from the fifth point to a seventh point, and communicating a potential from the sixth point to an eighth point;
the method further comprising measuring voltage between the seventh point and the eighth point.

18. The method of claim 17 wherein the bonds are welded.

19. The method of claim 17 wherein the composition of the fifth material and the composition of the fourth material are identical.

20. The method of claim 17 wherein the material between the fifth and seventh points is of differing composition than the material between the fifth and second points, and wherein the material between the sixth and eighth points is of differing composition than the material between the sixth and third points.

21. Apparatus for current measurement, the apparatus comprising a shunt, the shunt defining a current flow path from a first point to a second point to a third point to a fourth point;
the shunt composed between the first point and the second point of a first material;
the shunt composed between the second point and the third point of a second material;
the shunt composed between the third point and the fourth point of a third material;
the apparatus further comprising a first sensing line from a first sensing point to a fifth point, the first sensing line composed between the first sensing and the fifth point of a fourth material;
the apparatus further comprising a second sensing line from a sixth point to the second sensing point, second sensing line composed between the sixth point and the third point of a fifth material;
the first and fourth materials being of non-identical composition and being electrically and mechanically bonded;
the third and fifth materials being of non-identical composition and being electrically and mechanically bonded;
the first and third materials being electrically conductive;
the second material being of higher resistance than the first and third materials;
a conductor from the fifth point to a seventh point, said conductor composed of a sixth material non-identical to the fourth material,
a conductor from the sixth point to an eighth point, said conductor composed of a seventh material non-identical to the fifth material,
the fifth and sixth points juxtaposed nearby to each other, the fifth and sixth points taken together being thermally isolated from the shunt;
the seventh point and the eighth point disposed for connection to a voltage measurement apparatus.

22. The apparatus of claim 21 wherein the bonds are welded.

23. The apparatus of claim 21 wherein the composition of the fourth material and the composition of the fifth material are identical.

24. The apparatus of claim 23 wherein the composition of the second material is identical to that of the fourth and fifth materials.

25. The apparatus of claim 21 further comprising a current measurement apparatus connected to the seventh point and to the eighth point.

26. The apparatus of claim 21 wherein the current flow path from the first point to the second point to the third point to the fourth point is substantially along a straight line.

27. The apparatus of claim 21 wherein the material between the fifth and seventh points is of differing composition than the material between the fifth point and the first sensing point, and wherein the material between the sixth and eighth points is of differing composition than the material between the sixth point and the second sensing point.

28. The method of claim 1, whereby the location of the fifth and sixth points juxtraposed nearby to each other tend to cause them to be substantially the same temperature.

29. The apparatus of claim 8, whereby the location of the fifth and sixth points juxtraposed nearby to each other tend to cause them to be substantially the same temperature.

30. The method of claim 17, whereby the location of the fifth and sixth points juxtraposed nearby to each other tend to cause them to be substantially the same temperature.

31. The apparatus of claim 21, whereby the location of the fifth and sixth points juxtraposed nearby to each other tend to cause them to be substantially the same temperature.

\* \* \* \* \*